US008638562B2

(12) United States Patent
Chen

(10) Patent No.: US 8,638,562 B2
(45) Date of Patent: Jan. 28, 2014

(54) COMBINATIVE POWER DEVICE

(75) Inventor: Yung Sung Chen, Taoyuan County (TW)

(73) Assignee: Phihong Technology Co., Ltd., Guishan Township, Taoyuan County (TW)

( * ) Notice: Subject to any disclaimer, the term of this patent is extended or adjusted under 35 U.S.C. 154(b) by 169 days.

(21) Appl. No.: 13/312,282

(22) Filed: Dec. 6, 2011

(65) Prior Publication Data

US 2013/0070425 A1 Mar. 21, 2013

(30) Foreign Application Priority Data

Sep. 16, 2011 (TW) ............................. 100133521 A

(51) Int. Cl.
*H05K 5/00* (2006.01)

(52) U.S. Cl.
USPC ........................................... 361/731; 361/729

(58) Field of Classification Search
USPC .................................... 361/679.01, 728–732
See application file for complete search history.

(56) References Cited

U.S. PATENT DOCUMENTS

| | | | | |
|---|---|---|---|---|
| 7,303,440 | B2 * | 12/2007 | Stull et al. | 439/620.04 |
| 7,632,119 | B1 * | 12/2009 | Ma et al. | 439/172 |
| 8,308,496 | B2 * | 11/2012 | Youssefi-Shams et al. | 439/172 |
| 2010/0190363 | A1 * | 7/2010 | Green et al. | 439/131 |
| 2013/0094154 | A1 * | 4/2013 | Shen | 361/731 |

* cited by examiner

*Primary Examiner* — Bernard Rojas
(74) *Attorney, Agent, or Firm* — Chih Feng Yeh; Huntington IP Consulting Co., Ltd.

(57) ABSTRACT

The present invention provides a combinative power device. In one aspect, the combinative power device of the present invention includes an AC-to-DC module including a first joint portion; and a DC-to-DC module having a second joint portion and coupled to the AC-to-DC module by the second joint portion with the first joint portion electrically, wherein the DC-to-DC module acts as a removable module which can be removable from the AC-to-DC module to enable the AC-to-DC module to cooperate with different types of the DC-to-DC module.

7 Claims, 13 Drawing Sheets

COMBINATIVE POWER DEVICE

FIELD OF THE INVENTION

The present invention relates to power devices, and more particularly to combinative power devices.

BACKGROUND OF THE INVENTION

Consumer electronic products, such as notebooks, personal digital assistants (PDA), mobile phones, MP3 players, and so on, are trending toward smaller sizes continuously, which thereby promotes higher demand for easily-portable electric power connectors, for example, a power supply, a battery charger, or a transformer. Therefore, the electric power connectors of consumer electronic products need to be made with smaller sizes and less weight, and more convenient for shipment. Furthermore, they must be durable in order to sustain long-term carrying and frequent usage.

For the presently common battery chargers or transformers, most of different types of batteries or devices must be charged or powered by utilizing different kinds of battery chargers or transformers. If the user carries different types of mobile devices at the same time, the batteries or the transformers thereof usually differ. Therefore, the user has to carry various kinds of battery chargers or transformers to maintain the power of each type of mobile devices in normal ranges, which is inconvenient to the user and will increase the weight of items needed to be taken along by the user.

Moreover, when a light emitting diode power supply is disposed in a light emitting diode lamp holder, for the lamp holders with different numbers of light emitting diode modules, the light emitting diode power supply must have corresponding numbers of contact points to power each light emitting diode module. Therefore, when the number of the light emitting diode modules changes, the manufacturing process for the light emitting diode power supply must be modified.

Furthermore, any of the battery charger, the transformer or the light emitting diode power supply has an AC-to-DC portion and a portion to further process the direct current and output the processed direct current. The AC-to-DC portion usually needs to be performed with safety inspection. Therefore, when a new type of battery charger, transformer or light emitting diode power supply is developed, the entire of the new type of battery charger, transformer or light emitting diode power supply must be implemented with safety inspection, thereby delaying the time-to-market.

Accordingly, there is still a need for a solution to solve the aforementioned problems.

SUMMARY OF THE INVENTION

To solve the aforementioned various problems, the present invention provides a combinative power device.

The present invention provides a combinative power device, including an AC-to-DC module including a first joint portion; and a DC-to-DC module having a second joint portion and coupled to the AC-to-DC module by the second joint portion with the first joint portion electrically, wherein the DC-to-DC module acts as a removable module which can be removable from the AC-to-DC module to enable the AC-to-DC module to cooperate with different types of the DC-to-DC module.

In one aspect, the present invention provides a combinative power device, including an AC-to-DC module including at least one projected portion and a cavity formed on the side wall of one end of the AC-to-DC module, wherein a flange is disposed on the outer edge of the at least one projected portion; and a DC-to-DC module including at least one concave portion and a flexible slice formed on the side wall of one end of the DC-to-DC module, wherein a flange is disposed on the outer edge of the at least one concave portion and a projected piece is disposed on the flexible slice to be locked by the cavity, the at least one concave portion receiving the at least one projected portion, the flange of the at least one concave portion locking the flange of the at least one projected portion.

In another aspect, the present invention provides a combinative power device, including an AC-to-DC module including a first hole and a second hole formed thereon, the first hole including a first partial hole and a second partial hole, the second hole including a first partial hole and a second partial hole, widths or diameters of the first partial hole of the first hole and the first partial hole of the second hole being larger than widths or diameters of the second partial hole of the first hole and the second partial hole of the second hole respectively, the first partial hole of the first hole connecting one end of the second partial hole of the first hole, the second partial hole of the second hole connecting one side of the first partial hole of the second hole; and a DC-to-DC module including a main body, a first pin and a second pin, wherein the first pin and the second pin are disposed on the main body, widths or diameters of first portions of the first pin and the second pin which are close to the main body being smaller than widths or diameters of second portions of the first pin and the second pin which are far from the main body respectively, the second portion of the first pin which is far from the main body being inserted into the first partial hole of the first hole, the first portion of the first pin which is close to the main body being slid into the second partial hole of the first hole, the second portion of the second pin which is far from the main body being inserted into the first partial hole of the second hole, the first portion of the second pin which is close to the main body being slid into the second partial hole of the second hole.

One advantage of the present invention is that the DC-to-DC module or the AC-to-DC module of the combinative power device of the present invention can be flexibly replaced with DC-to-DC modules or AC-to-DC modules of other specifications.

Another advantage of the present invention is that the combinative power device of the present invention can enhance the robustness of the entire structure in the horizontal direction or the vertical direction.

Still another advantage of the present invention is that the combinative power device of the present invention can shorten the time-to-market for the power device.

Yet another advantage of the present invention is that the present invention can decrease the weight of the transformers or the battery chargers needed to be taken along by the user.

These and other advantages will become apparent from the following description of preferred embodiments taken together with the accompanying drawings and the appended claims.

BRIEF DESCRIPTION OF THE DRAWINGS

The present invention may be understood by some preferred embodiments and detailed descriptions in the specification and the attached drawings below. The identical reference numbers in the drawings refer to the same components in the present invention. However, it should be appreciated that all the preferred embodiments of the invention are provided only for illustrating but not for limiting the scope of the Claims and wherein:

DETAILED DESCRIPTION OF THE PREFERRED EMBODIMENT

The invention will now be described with the preferred embodiments and aspects and these descriptions interpret structure and procedures of the invention only for illustrating but not for limiting the Claims of the invention. Therefore, except the preferred embodiments in the specification, the present invention may also be widely used in other embodiments.

The present invention provides a combinative power device, which includes an AC-to-DC module and a DC-to-DC module. The AC-to-DC module and the DC-to-DC module may be combined through chutes or through the locking mechanism between holes and pins. The combinative power device of the present invention may be applied to light emitting diode power supplies, battery chargers or transformers with changeable converters. In one embodiment, the battery chargers may include but be not limited to lithium battery chargers, AA battery chargers, AAA battery chargers, etc.

Figure 1:
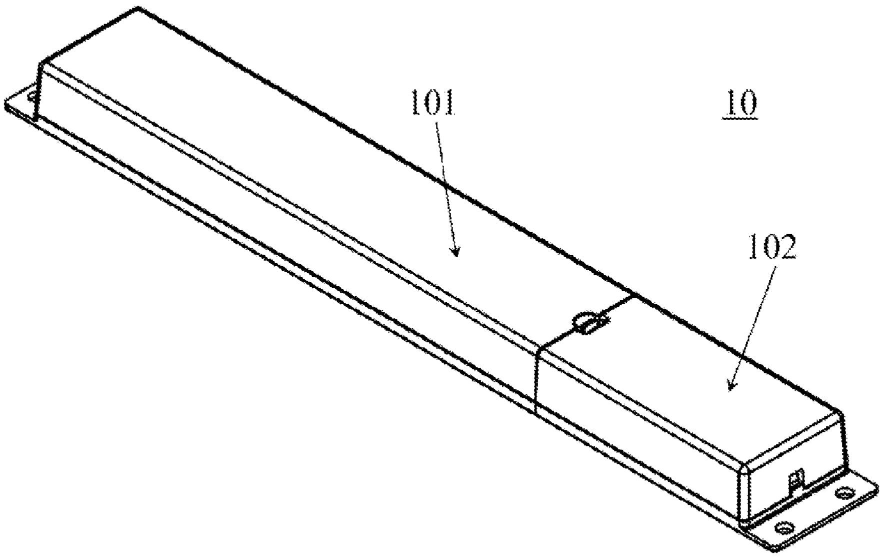
FIG. 1 illustrates a diagram of a combinative power device in accordance with one embodiment of the present invention.
Figure 2:
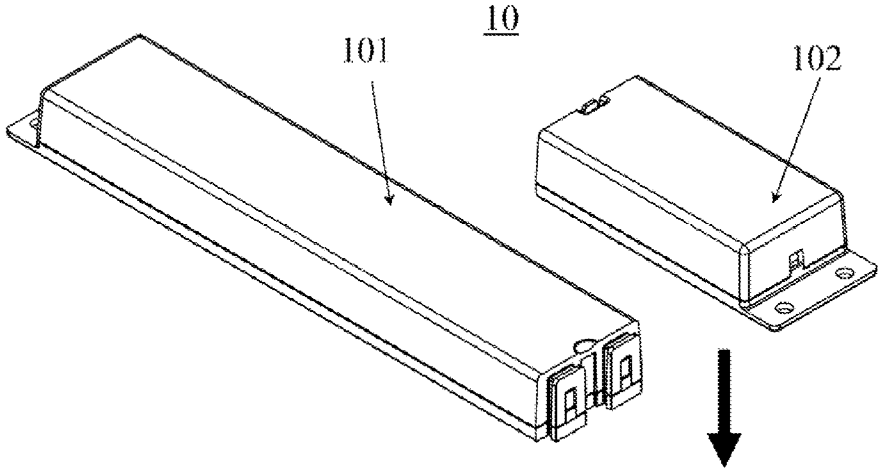
FIG. 2 illustrates a combining diagram of a combinative power device in accordance with one embodiment of the present invention.
Figure 10:
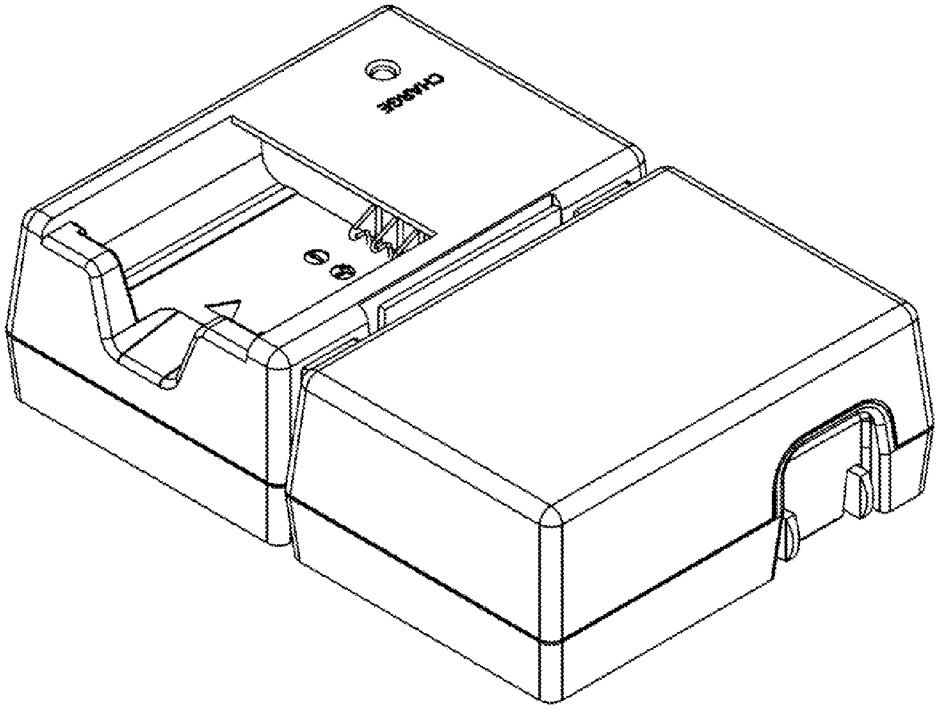
FIG. 10 illustrates a diagram of a combinative power device in accordance with another embodiment of the present invention.

In one embodiment of the present invention, as shown in FIG. 1, the combinative power device 10 may include an AC-to-DC module 101 and a DC-to-DC module 102, the inner AC-to-DC circuits of which is well-known and therefore is omitted. As shown in FIG. 1, the exemplary combinative power device shown in the present embodiment is employed for the light emitting diode power supply, for illustrating the present invention but not for limiting the present invention. Therefore, the combinative power device shown in FIG. 1 may also be applied to the battery charger (as shown in FIG. 10) or the transformer with the changeable converter. In the present embodiment, the AC-to-DC module 101 and the DC-to-DC module 102 may be combined through chutes. As shown in FIG. 2, one end of the AC-to-DC module 101 may be slid into the grooves in the DC-to-DC module 102 to combine both.

Figure 3:
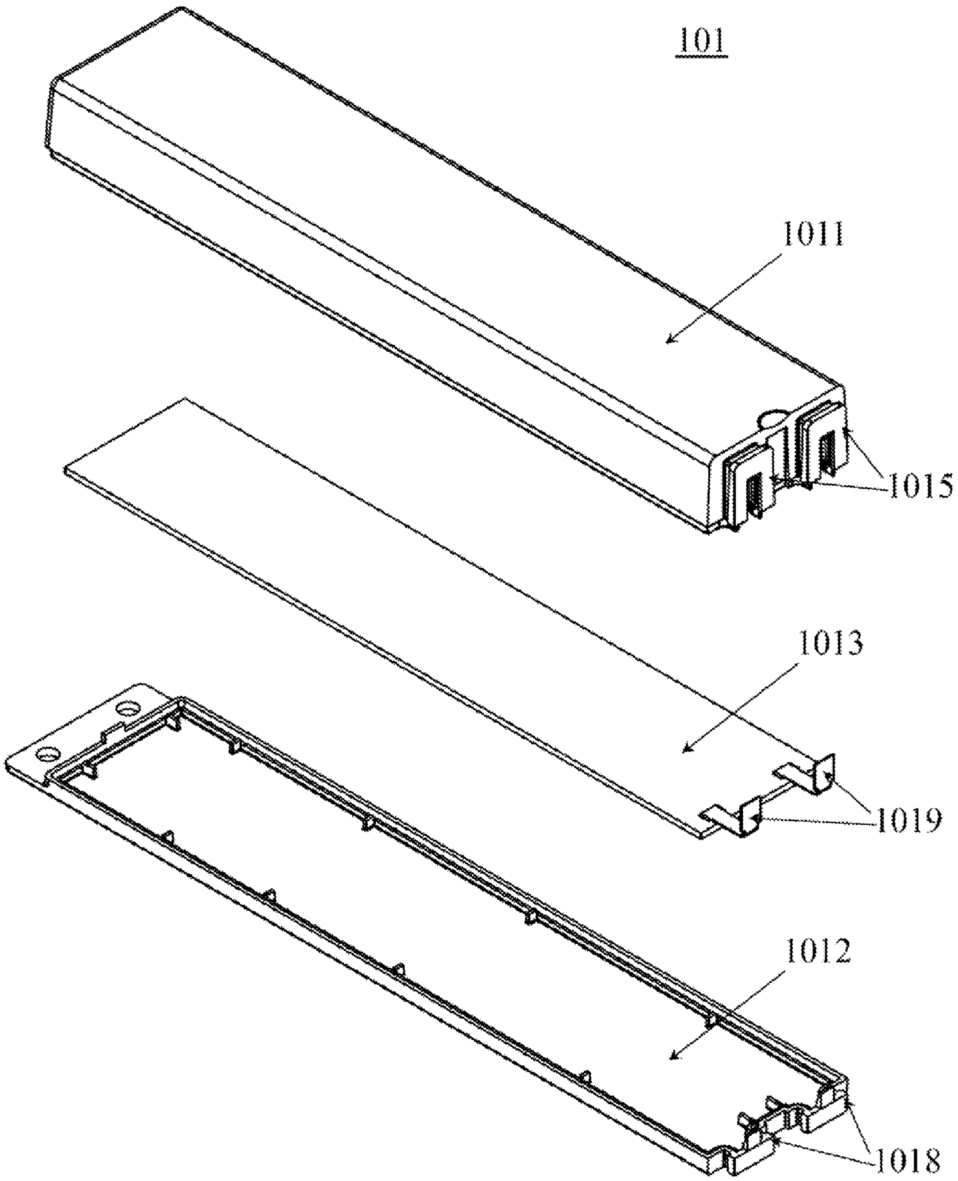
FIG. 3 illustrates an exploded view of an AC-to-DC module of a combinative power device in accordance with one embodiment of the present invention.
Figure 5:
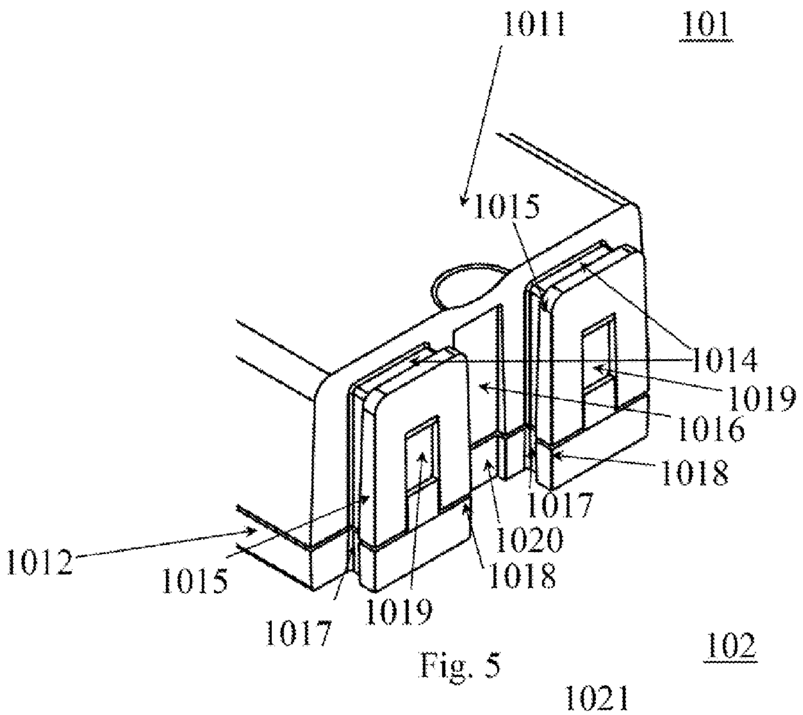
FIG. 5 illustrates a partial view of an AC-to-DC module of a combinative power device in accordance with one embodiment of the present invention.

FIGS. 3 and 5 illustrate the structure of the AC-to-DC module 101. The AC-to-DC module 101 may include a first joint portion. As shown in FIG. 3, the AC-to-DC module 101 may include an upper case 1011, a lower case 1012 and a circuit board 1013 to dispose circuits and electronic elements (not shown) thereon. The circuit board 1013 is disposed on the lower case 1012 while the upper case 1011 is disposed on the circuit board 1013. Conductive slices 1019 are disposed at one end of the circuit board 1013. In one embodiment, the material of the conductive slices 1019 may be metal or alloy. As shown in FIG. 5, the first joint portion is disposed on the side wall of one end of the upper case 1011 and may include projected portions 1014. Flanges 1015 are disposed on the outer edges of the projected portions 1014. The centers of the projected portions 1014 are disposed with openings for the conductive slices (which will be described hereinafter) of the DC-to-DC module 102 to partially pass therethrough and electrically couple with the conductive slices 1019 of the AC-to-DC module 101. The openings are adjacent to the conductive slices 1019. As shown in FIG. 5, a cavity 1016 is disposed on the side wall of the upper case 1011 and between the projected portions 1014 to lock a projected piece (which will be described hereinafter) of the DC-to-DC module 102. As shown in FIG. 5, projected portions 1017 are disposed on the side wall of one end of the lower case 1012. Flanges 1018 are disposed on the outer edges of the projected portions 1017. A cavity 1020 is disposed on the side wall of the lower case 1012 and between the projected portions 1017. The sizes and the contours of the projected portions 1017, the flanges 1018 and the cavity 1020 correspond to those of the projected portions 1014, the flanges 1015 and the cavity 1016 respectively so as to form continuous structures. The first joint portion is utilized to joint a removable module.

Figure 4:
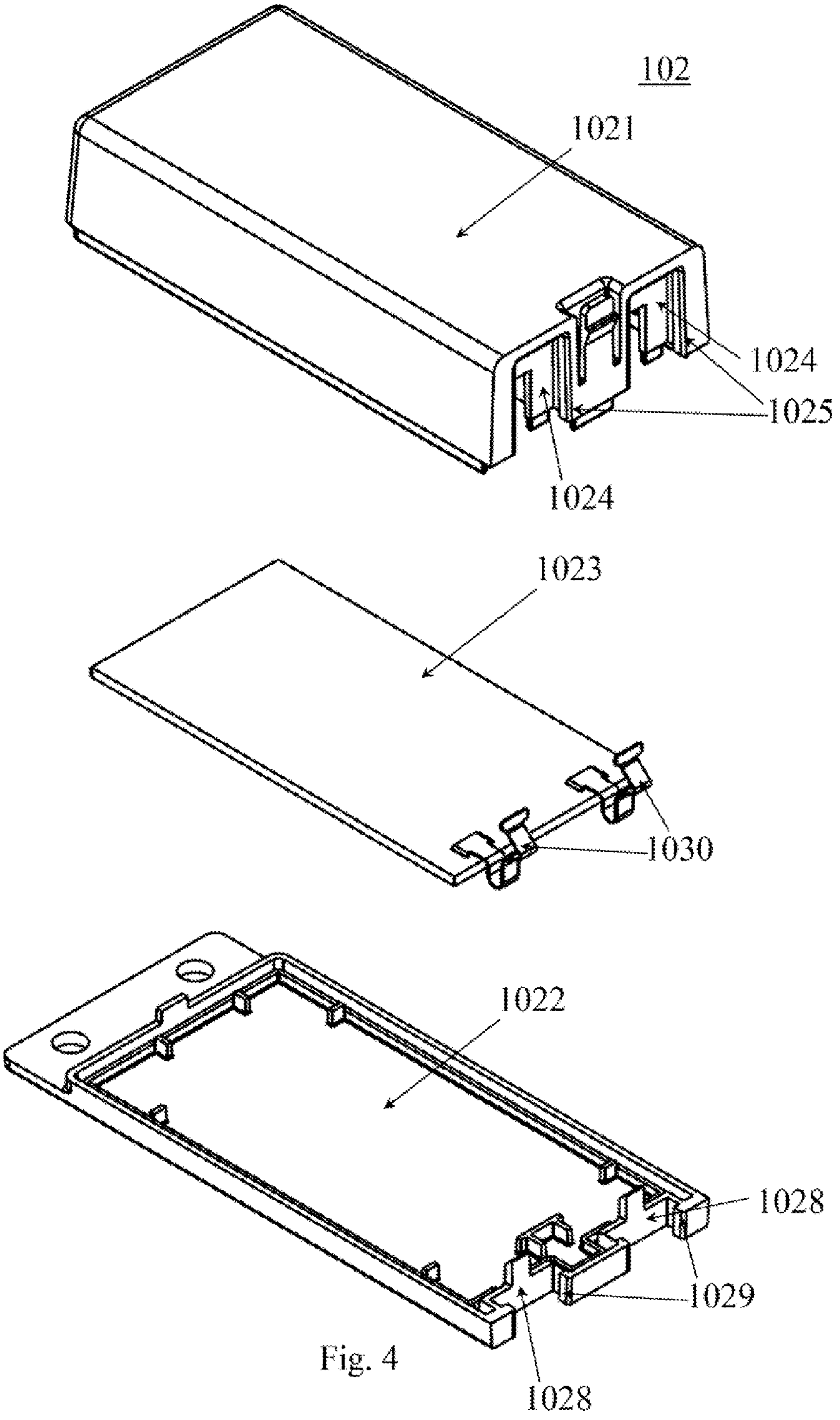
FIG. 4 illustrates an exploded view of a DC-to-DC module of a combinative power device in accordance with one embodiment of the present invention.
Figure 6:
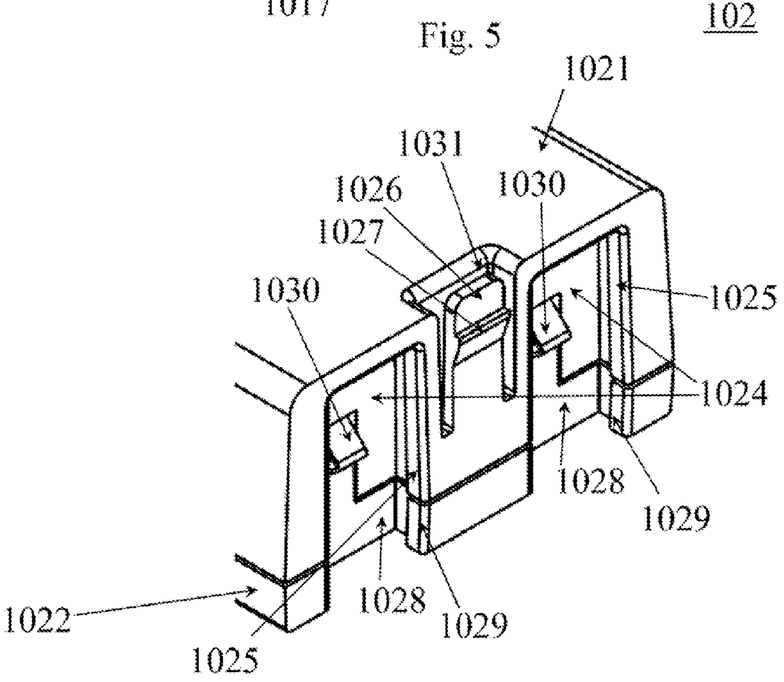
FIG. 6 illustrates a partial view of a DC-to-DC module of a combinative power device in accordance with one embodiment of the present invention.

As shown in FIG. 4, the removable module may include a DC-to-DC module 102, which may include an upper case 1021, a lower case 1022 and a circuit board 1023 to dispose circuits and electronic elements (not shown) thereon. The DC-to-DC module 102 may include a second joint portion. The circuit board 1023 is disposed on the lower case 1022 while the upper case 1021 is disposed on the circuit board 1023. Conductive slices 1030 are disposed at one end of the circuit board 1023. In one embodiment, the material of the conductive slices 1030 may be metal or alloy. As shown in FIGS. 4 and 6, the second joint portion is disposed on the side wall of one end of the upper case 1021 to joint the first joint portion. The second joint portion is disposed with concave portions 1024 to receive the projected portions 1014 of the AC-to-DC module 101. Flanges 1025 are disposed on the outer edges of the concave portions 1024 to lock the flanges 1015 of the AC-to-DC module 101. The centers of the concave portions 1024 are disposed with openings for the conductive slices 1030 to partially pass therethrough and electrically couple with the conductive slices 1019 of the AC-to-DC module 101. The openings are adjacent to the conductive slices 1030.

As shown in FIG. 6, a cavity 1031 is disposed on the side wall of the upper case 1021 and between the concave portions 1024, and a flexible slice 1026 is disposed in the cavity 1031. A projected piece 1027 is disposed on the flexible slice 1026 to be locked by the cavity 1016 of the AC-to-DC module 101, such that the robustness of the entire structure in the vertical direction may be enhanced through the locking mechanism between the cavity 1016 and the projected piece 1027. The flexible slice 1026 is flexible, such that the projected piece 1027 will be detached from the cavity 1016, and the projected portions 1014 and the flanges 1015 of the AC-to-DC module 101 will be able to be slid out of the concave portions 1024 of the DC-to-DC module 102 when the flexible slice 1026 is shifted towards the inner of the cavity 1031. Therefore, the DC-to-DC module 102 will be able to be detached from the AC-to-DC module 101. As shown in FIG. 6, concave portions 1028 are disposed on the side wall of one end of the lower case 1022 to receive the projected portions 1017 of the AC-to-DC module 101. Flanges 1029 are disposed on the outer edges of the concave portions 1028 to lock the flanges 1018 of the AC-to-DC module 101. The sizes and the contours of the concave portions 1028 and the flanges 1029 correspond to those of the concave portions 1024 and the flanges 1025 respectively so as to form continuous structures.

Figure 7:
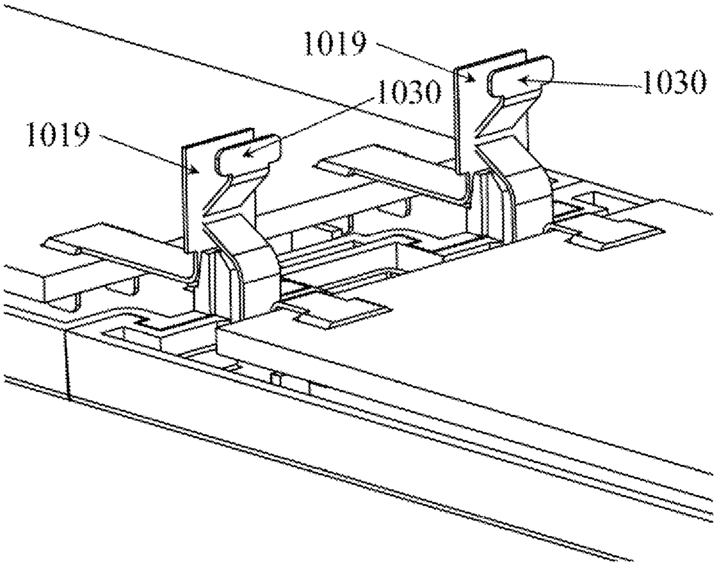
FIGS. 7 and 8 illustrate a partial perspective view of a combinative power device in accordance with one embodiment of the present invention.
Figure 8:
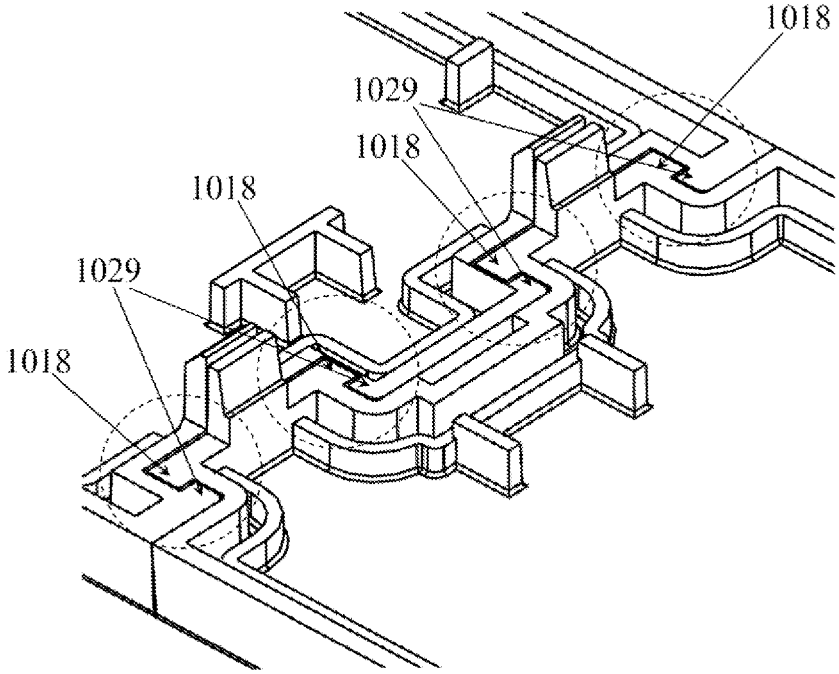
Figure 9:
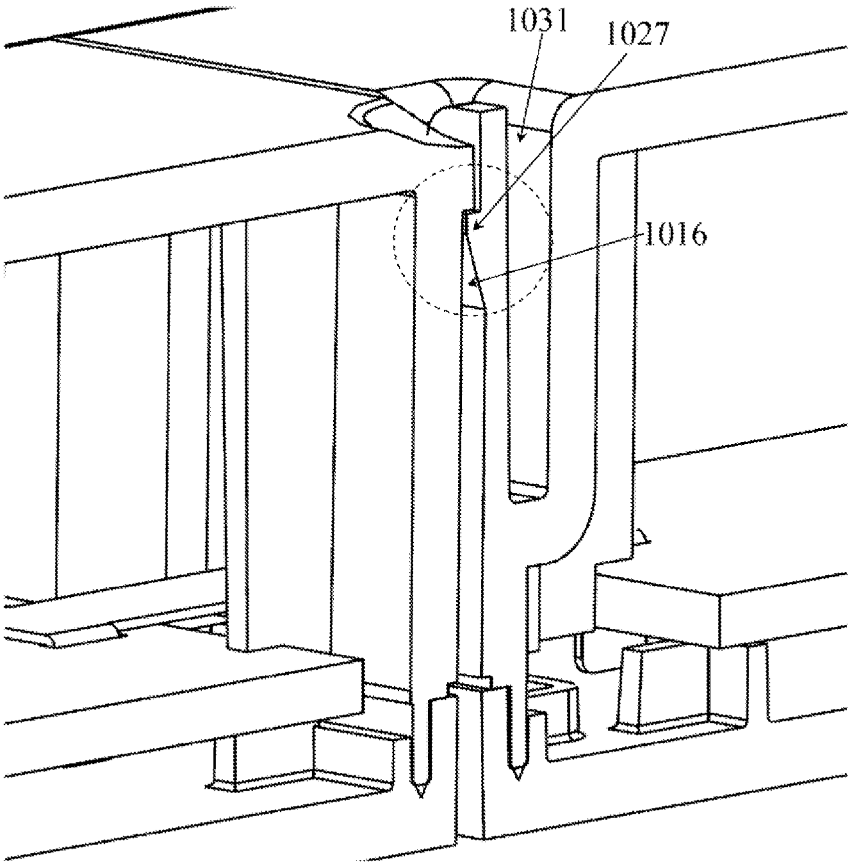
FIG. 9 illustrates a partial sectional view of a combinative power device in accordance with one embodiment of the present invention.

As shown in FIG. 7, after the AC-to-DC module 101 is combined with the DC-to-DC module 102, the conductive slice 1019 and the conductive slice 1030 may contact each other, so as to form electrical coupling. As shown in FIG. 8, after the AC-to-DC module 101 is combined with the DC-to-DC module 102, the flanges 1018 and the flanges 1029 may lock each other, so as to improve the robustness of the entire structure in the horizontal direction. In the same way, the flanges 1015 and the flanges 1025 may also lock each other (not shown). As shown in FIG. 9, after the AC-to-DC module 101 is combined with the DC-to-DC module 102, the cavity 1016 may lock the projected piece 1027, such that the robustness of the entire structure in the vertical direction will be further enhanced.

Figure 11:
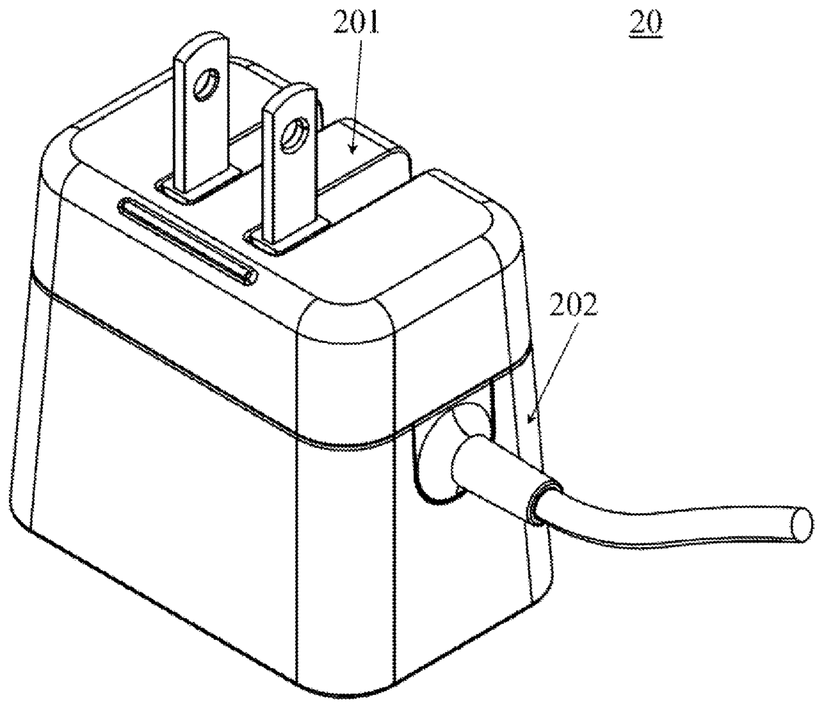
FIG. 11 illustrates a diagram of a combinative power device in accordance with still another embodiment of the present invention.
Figure 12:
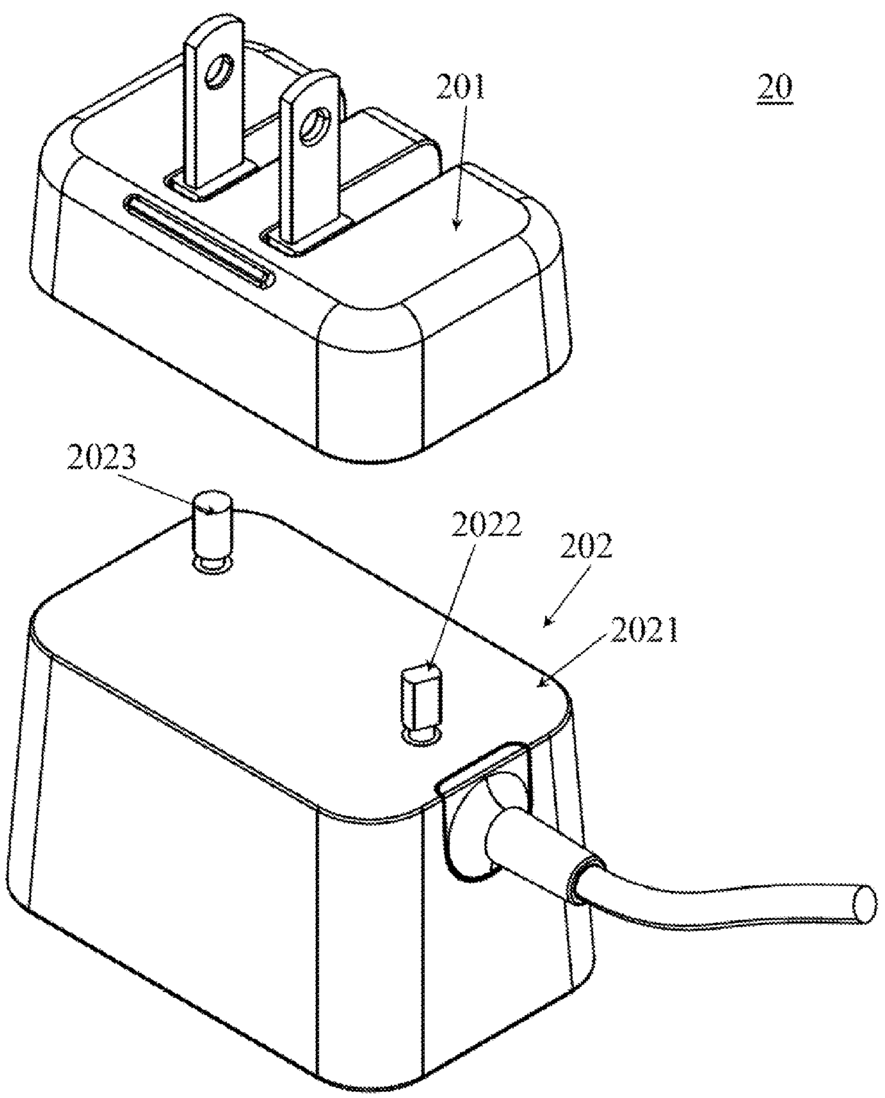
FIGS. 12 and 13 illustrate a diagram of a combinative power device in accordance with still another embodiment of the present invention.
Figure 13:
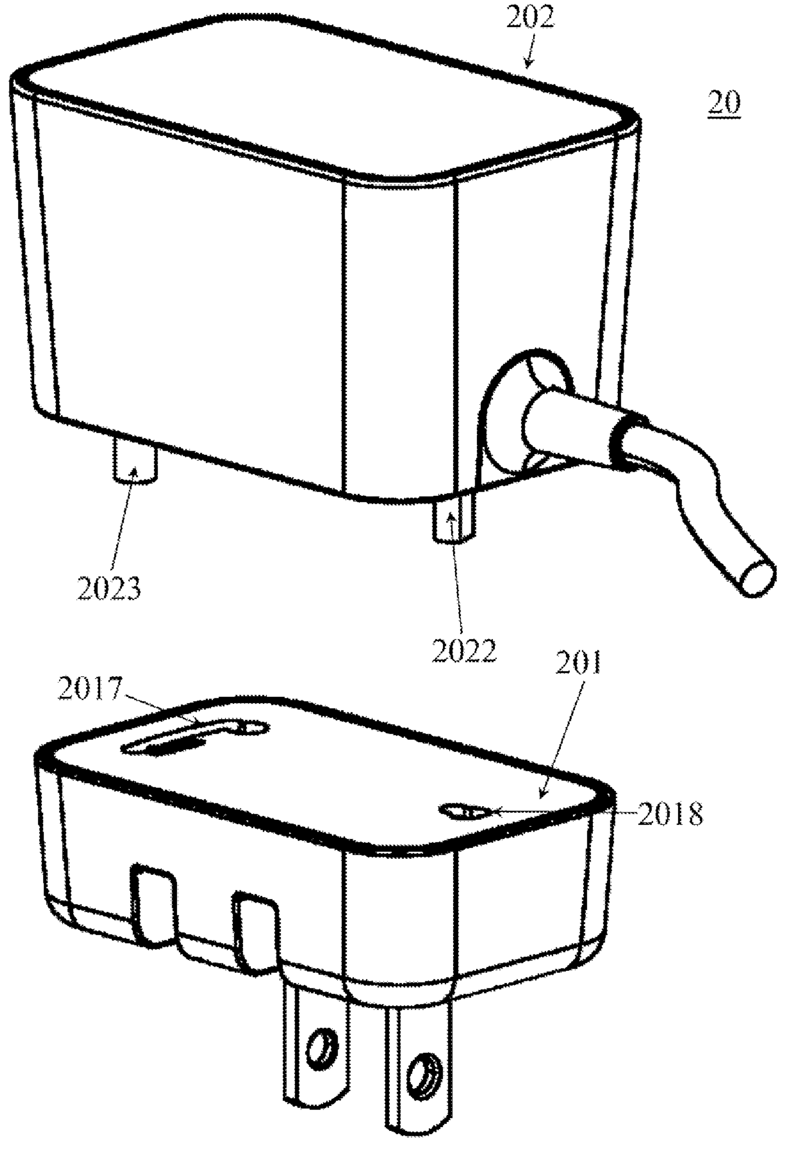
Figure 14:
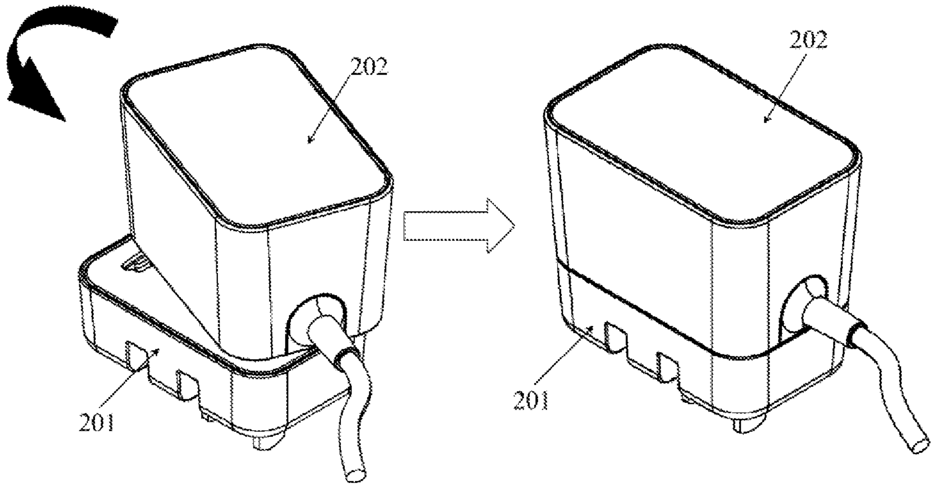
FIG. 14 illustrates a combining diagram of a combinative power device in accordance with still another embodiment of the present invention.

FIG. 11 illustrates a diagram of a combinative power device in accordance with another embodiment of the present invention. As shown in FIG. 11, the exemplary combinative power device shown in the present invention may be utilized for the transformers with changeable converters, for illustrating the present invention but not for limiting the present invention. Therefore, the combinative power device shown in FIG. 11 may also be applied to the battery chargers or the light emitting diode power supply. As shown in FIG. 11, in another embodiment of the present invention, the combinative power device 20 may include an AC-to-DC module 201 and a DC-to-DC module 202. A plug in the AC-to-DC module 201 may be rotatable, such that the plug may be rotated out of or into the case. As shown in FIGS. 12 and 13, the DC-to-DC module 202 may include a pin 2022 and a pin 2023 while the AC-to-DC module 201 may include a hole 2017 and a hole 2018. As shown in FIGS. 13 and 14, the pin 2022 and the pin 2023 may be inserted into the hole 2018 and the hole 2017 respectively, and the DC-to-DC module 202 may be moved a predetermined distance towards the hole 2017 and rotated counter clockwise, so as to render the pin 2022 and the pin 2023 to be locked by the hole 2018 and the hole 2017 respectively and combine the AC-to-DC module 201 and the DC-to-DC module 202.

As shown in FIG. 12, the DC-to-DC module 202 may include a main body 2021, the pin 2022 and the pin 2023. The pin 2022 and the pin 2023 are disposed on the main body 2021. In one embodiment, the pin 2022 and the pin 2023 may be disposed asymmetrically. Both the pin 2023 and the pin 2022 have two different diameters or widths. The diameter or the width of one end of the pin 2023 and the pin 2022 which is far from the main body is larger than that of another end of the pin 2023 and the pin 2022 which is close to the main body. In one embodiment, both ends of the pin 2023 may be cylindrical. In another embodiment, the end of the pin 2023 which is close to the main body may be cylindrical while the end of the pin 2023 which is far from the main body may be geometric pillar shaped. The geometric pillar may include but be not limited to cylinder and rectangular prism, for example square prism. In one embodiment, the end of the pin 2022 which is close to the main body may be cylindrical. In one embodiment, the end of the pin 2022 which is far from the main body may be chamfered-edge cylinder shaped.

Figure 15:
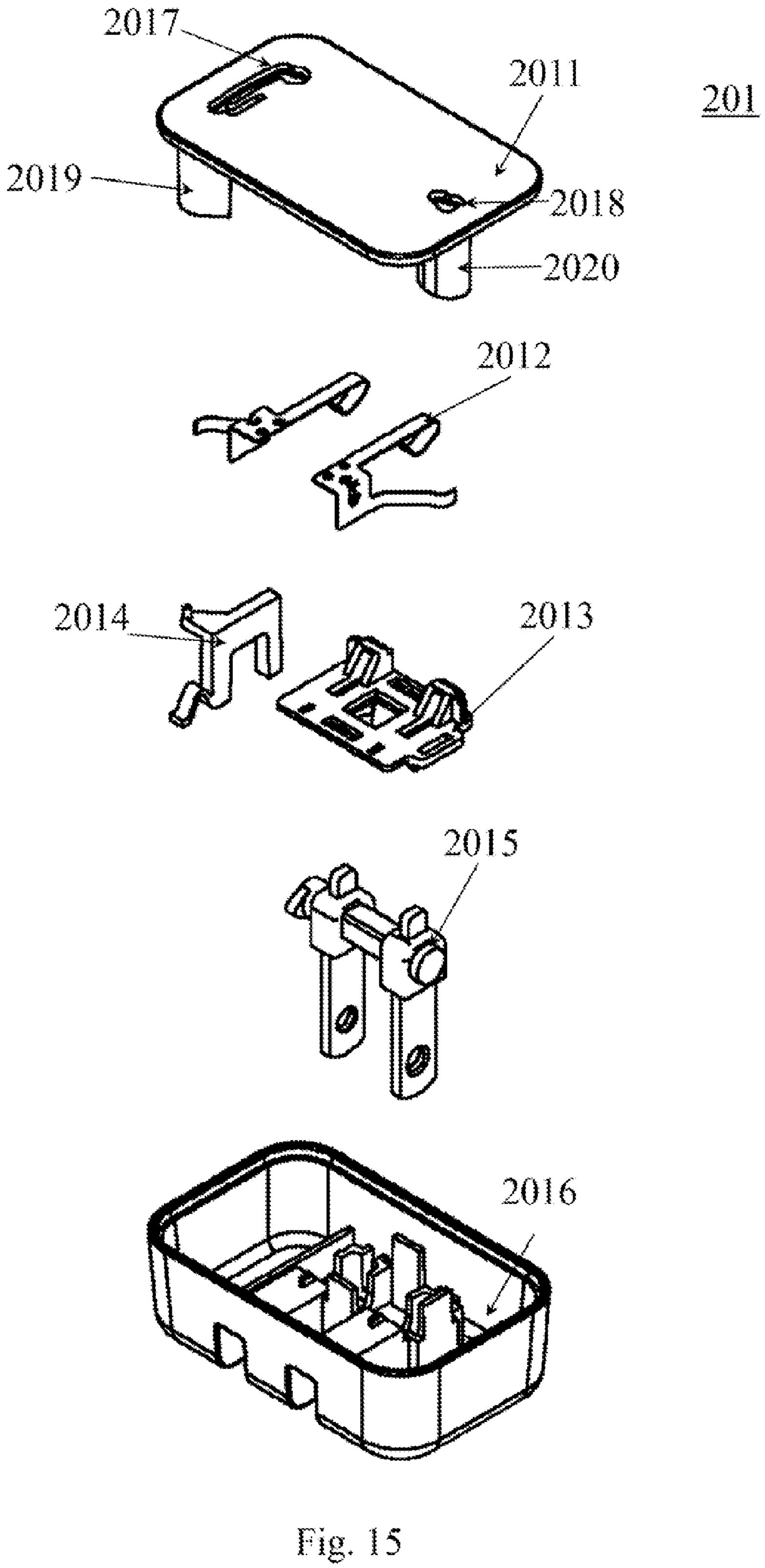
FIG. 15 illustrates a exploded view of an AC-to-DC module of a combinative power device in accordance with still another embodiment of the present invention.

As shown in FIG. 15, the AC-to-DC module 201 may include an upper case 2011, conductive slices 2012, a fixing member 2013, a fixing rack 2014, a rotatable rack 2015 and a lower case 2016. As shown in FIG. 15, the rotatable rack 2015 is disposed on the lower case 2016 while the fixing member 2013 and the fixing rack 2014 are disposed on the rotatable rack 2015. The conductive slices 2012 are disposed on the fixing member 2013 while the upper case 2011 is disposed on the conductive slices 2012.

With reference to FIG. 15, the upper case 2011 may include a hole 2017 and a hole 2018. In one embodiment, the hole 2017 may include a first partial hole, for example a geometric hole, which may include but be not limited to a circular hole and a rectangular hole such as a square hole, and a second partial hole, for example a long curved hole, so as to be inserted by the pin 2023 of the DC-to-DC module 202. The first partial hole connects with one end of the second partial hole. The width or the diameter of the first partial hole is larger than that of the second partial hole. The widths or the diameters of the first partial hole and the second partial hole substantially match those of the end of the pin 2023 which is far from the main body and the end of the pin 2023 which is close to the main body respectively, such that after the end of the pin 2023 which is far from the main body is inserted into the first partial hole for example the geometric hole, if the end of the pin 2023 which is close to the main body passes through the geometric hole, the end of the pin 2023 which is close to the main body can enter the second partial hole such as the long curved hole and the DC-to-DC module 202 can be rotated counter clockwise around the pin 2022 to render the end of the pin 2023 which is close to the main body to be slid into the long curved hole and perform locking mechanism.

In one embodiment, the hole 2018 may include a first partial hole, for example a chamfered-edge circular hole, and a second partial hole, such as a semicircular hole. In one embodiment, the second partial hole connects with one side of the first partial hole. For example, the chamfered-edge portion of the semicircular hole connects with the chamfered-edge portion of the chamfered-edge circular hole. The width or the diameter of the first partial hole is larger than that of the second partial hole. The shapes and the sizes of the first partial hole and the second partial hole substantially match the section shapes and the sizes thereof of the end of the pin 2022 which is far from the main body and the end of the pin 2022 which is close to the main body respectively, such that after the end of the pin 2022 which is far from the main body is inserted into the first partial hole for example the chamfered-edge circular hole, if the end of the pin 2022 which is close to the main body passes through the chamfered-edge circular hole, the end of the pin 2022 which is close to the main body can be slid into the second partial hole such as the semicircular hole to perform the rotation of the DC-to-DC module 202. While the end of the pin 2023 which is close to the main body initially enters the long curved hole, the end of the pin 2022 which is close to the main body will be slid into the semicircular hole.

Figure 16:
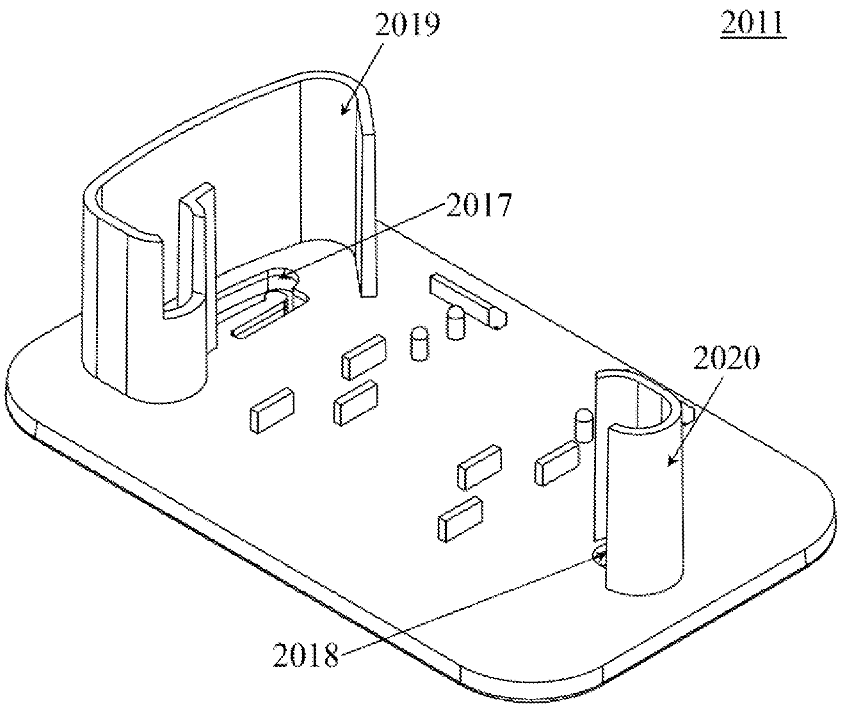
FIG. 16 illustrates a diagram of an upper case of an AC-to-DC module of a combinative power device in accordance with still another embodiment of the present invention.

With reference to FIGS. 15 and 16, the upper case 2011 further includes a baffle 2019 and a baffle 2020 formed on the lower surface thereof. The baffle 2019 surrounds the hole 2017 while the baffle 2020 surrounds the hole 2018. As shown in FIG. 15, the rotatable rack 2015 is inserted into two through holes in the lower case 2016, such that the rotatable rack 2015 may be sandwiched in between the lower case 2016 and the fixing member 2013 and the fixing rack 2014 to perform the rotation. The conductive slices 2012 contact the shorter ends of the prongs of the rotatable rack 2015 which pass through the fixing member 2013 at one end and contact the pin 2022 or the pin 2023 which passes through the hole 2018 or the hole 2017 at the other end, so as to form electrical coupling between the prongs of the rotatable rack 2015 and the pin 2022 or the pin 2023. In one embodiment, the material of the conductive slices 2012 may be metal or alloy.

As aforementioned, the present invention employs the chutes or the locking mechanism between the holes and the pins to combine the AC-to-DC module and the DC-to-DC module, so as to provide the combinative power device. The aforementioned combinative power device may be applied to the light emitting diode power supplies, the transformers with changeable converters or the battery chargers. Therefore, the DC-to-DC module or the AC-to-DC module may be replaced with the DC-to-DC module or the AC-to-DC module of other specifications. For instance, if the combinative power device is a battery charger, the DC-to-DC module with battery charging cavity can be replaced with a DC-to-DC module having different types of battery charging cavities for different types of batteries. For example, a DC-to-DC module with AA battery charging cavity can be replaced with a DC-to-DC module with AAA battery or lithium battery charging cavity. The AC-to-DC module can also be replaced with an AC-to-DC module having plugs of different specifications. If the combinative power device is a light emitting diode power supply, the DC-to-DC module can be replaced with a DC-to-DC module for different numbers of light emitting diodes. If the combinative power device is a transformer with a changeable converter, the AC-to-DC module can be replaced with an AC-to-DC module having converters of different specifications.

Moreover, once the safety inspection of the AC-to-DC module is completed, the AC-to-DC module can cooperate with different kinds of DC-to-DC modules to facilitate its scalability and convenience for sales because the DC-to-DC module of the combinative power device of the present invention is replaceable and only the AC-to-DC module needs to be performed with safety inspection. Therefore, the combinative power device of the present invention can shorten the time-to-market for the power device. Furthermore, since the DC-to-DC module or the AC-to-DC module of the combinative power device of the present invention can be replaced with DC-to-DC modules or AC-to-DC modules of other specifications, the user is not required to carry different battery chargers or transformers for different mobile devices and only needs to carry necessary modules to replace, thereby the weight of the transformers or the battery chargers needed to be taken along by the user can be decreased.

The foregoing description is a preferred embodiment of the present invention. It should be appreciated that this embodiment is described for purposes of illustration only, not for limiting, and that numerous alterations and modifications may be practiced by those skilled in the art without departing from the spirit and scope of the invention. It is intended that all such modifications and alterations are included insofar as they come within the scope of the invention as claimed or the equivalents thereof.

What is claimed is:

1. A combinative power device, comprising:

an AC-to-DC module including a first hole and a second hole formed thereon, said first hole including a first partial hole and a second partial hole, said second hole including a first partial hole and a second partial hole, widths or diameters of said first partial hole of said first hole and said first partial hole of said second hole being larger than widths or diameters of said second partial hole of said first hole and said second partial hole of said second hole respectively, said first partial hole of said first hole connecting one end of said second partial hole of said first hole, said second partial hole of said second hole connecting one side of said first partial hole of said second hole; and a DC-to-DC module including a main body, a first pin and a second pin, wherein said first pin and said second pin are disposed on said main body, widths or diameters of first portions of said first pin and said second pin which are close to said main body being smaller than widths or diameters of second portions of said first pin and said second pin which are far from said main body respectively, said second portion of said first pin which is far from said main body being inserted into said first partial hole of said first hole, said first portion of said first pin which is close to said main body being slid into said second partial hole of said first hole, said second portion of said second pin which is far from said main body being inserted into said first partial hole of said second hole, said first portion of said second pin which is close to said main body being slid into said second partial hole of said second hole.

2. The device of claim 1, wherein said second portion of said first pin which is far from said main body is geometric pillar shaped, and said first portion of said first pin which is close to said main body is cylindrical.

3. The device of claim 2, wherein said geometric pillar includes cylinder or rectangular prism.

4. The device of claim 1, wherein said second portion of said second pin which is far from said main body is chamfered-edge cylinder shaped, and said first portion of said second pin which is close to said main body is cylindrical.

5. The device of claim 1, wherein said first partial hole of said first hole includes a geometric hole, and said second partial hole of said first hole includes a long curved hole.

6. The device of claim 5, wherein said geometric hole includes a circular hole or a rectangular hole.

7. The device of claim 1, wherein said first partial hole of said second hole includes a chamfered-edge circular hole, and said second partial hole of said second hole includes a semicircular hole.

* * * * *